(12) United States Patent
Shank et al.

(10) Patent No.: US 11,545,548 B1
(45) Date of Patent: Jan. 3, 2023

(54) GATE CONTACTS WITH AIRGAP ISOLATION

(71) Applicant: GLOBALFOUNDRIES U.S. Inc., Malta, NY (US)

(72) Inventors: Steven M. Shank, Jericho, VT (US); Anthony K. Stamper, Williston, VT (US); Venkata N. R. Vanukuru, Karnataka (IN)

(73) Assignee: GlobalFoundries U.S. Inc., Malta, NY (US)

(*) Notice: Subject to any disclaimer, the term of this patent is extended or adjusted under 35 U.S.C. 154(b) by 0 days.

(21) Appl. No.: 17/361,848

(22) Filed: Jun. 29, 2021

(51) Int. Cl.
| | | |
|---|---|---|
| *H01L 29/76* | (2006.01) | |
| *H01L 29/94* | (2006.01) | |
| *H01L 31/062* | (2012.01) | |
| *H01L 29/06* | (2006.01) | |
| *H01L 27/118* | (2006.01) | |
| *H01L 21/762* | (2006.01) | |
| *H01L 27/088* | (2006.01) | |

(52) U.S. Cl.
CPC ........ *H01L 29/0649* (2013.01); *H01L 21/762* (2013.01); *H01L 27/088* (2013.01); *H01L 27/11803* (2013.01); *H01L 2027/11831* (2013.01)

(58) Field of Classification Search
CPC . H01L 29/0649; H01L 21/762; H01L 27/088; H01L 27/11803; H01L 2027/11831
USPC ........................................................ 257/368
See application file for complete search history.

(56) References Cited

U.S. PATENT DOCUMENTS

| | | | | |
|---|---|---|---|---|
| 5,641,712 | A | * | 6/1997 | Grivna ................ H01L 23/5222 438/626 |
| 9,754,821 | B2 | * | 9/2017 | King ................ H01L 21/76829 |
| 10,157,777 | B2 | | 12/2018 | He et al. |
| 10,211,146 | B2 | | 2/2019 | He et al. |
| 10,340,352 | B2 | | 7/2019 | Shank et al. |
| 10,411,107 | B2 | | 9/2019 | Schutz et al. |
| 10,573,724 | B2 | | 2/2020 | Cheng |
| 2020/0373410 | A1 | | 11/2020 | Lee et al. |

OTHER PUBLICATIONS

A. Razavieh et al., "FinFET with Contact over Active-Gate for 5G Ultra-Wideband Applications," 2020 IEEE Symposium on VLSI Technology, 2020, pp. 1-2.

* cited by examiner

*Primary Examiner* — Theresa T Doan
(74) *Attorney, Agent, or Firm* — Thompson Hine LLP; Anthony Canale (57) ABSTRACT

Structures for a semiconductor device including airgap isolation and methods of forming a semiconductor device structure that includes airgap isolation. The structure includes a trench isolation region, an active region of semiconductor material surrounded by the trench isolation region, and a field-effect transistor including a gate within the active region. The structure further includes a dielectric layer over the field-effect transistor, a first gate contact coupled to the gate, and a second gate contact coupled to the gate. The first and second gate contacts are positioned in the dielectric layer over the active region, and the second gate contact is spaced along a longitudinal axis of the gate from the first gate contact. The structure further includes an airgap including a portion positioned in the dielectric layer over the gate between the first and second gate contacts.

20 Claims, 14 Drawing Sheets

GATE CONTACTS WITH AIRGAP ISOLATION

BACKGROUND

The present invention relates to semiconductor device fabrication and integrated circuits and, more specifically, to structures for a semiconductor device including airgap isolation and methods of forming a semiconductor device structure that includes airgap isolation.

A low-noise amplifier is an electronic amplifier that is capable of amplifying a low-power signal without significantly degrading its signal-to-noise ratio. A low-noise amplifier includes one or more field-effect transistors in its construction. For certain applications, a reduced gate resistance is needed to improve the noise figure, particularly at frequencies through the 2 gigahertz to 28 gigahertz band. Contacts placed directly over the gate within the active region of a field-effect transistor may be effective to reduce the gate resistance, but also increases parasitic capacitance as a tradeoff. An increase in the parasitic capacitance tends to degrade gain and the noise figure.

Structures for a semiconductor device including airgap isolation and methods of forming a semiconductor device structure that includes airgap isolation are needed.

SUMMARY

In an embodiment of the invention, a structure includes a trench isolation region, an active region of semiconductor material surrounded by the trench isolation region, and a field-effect transistor including a gate within the active region. The structure further includes a dielectric layer over the field-effect transistor, a first gate contact coupled to the gate, and a second gate contact coupled to the gate. The first gate contact and the second gate contact are positioned in the dielectric layer over the active region, and the second gate contact is spaced along a longitudinal axis of the gate from the first gate contact. The structure further includes an airgap having a portion positioned in the dielectric layer over the gate between the first gate contact and the second gate contact.

In an embodiment of the invention, a method includes forming a trench isolation region that surrounds an active region of semiconductor material, and forming a field-effect transistor including a gate within the active region. The method further includes forming a dielectric layer over the field-effect transistor, and forming a first gate contact and a second gate contact that are coupled to the gate. The first gate contact and the second gate contact are positioned in the dielectric layer over the active region, and the second gate contact is spaced along a longitudinal axis of the gate from the first gate contact. The method further includes forming an airgap including a portion positioned in the dielectric layer over the gate between the first gate contact and the second gate contact.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
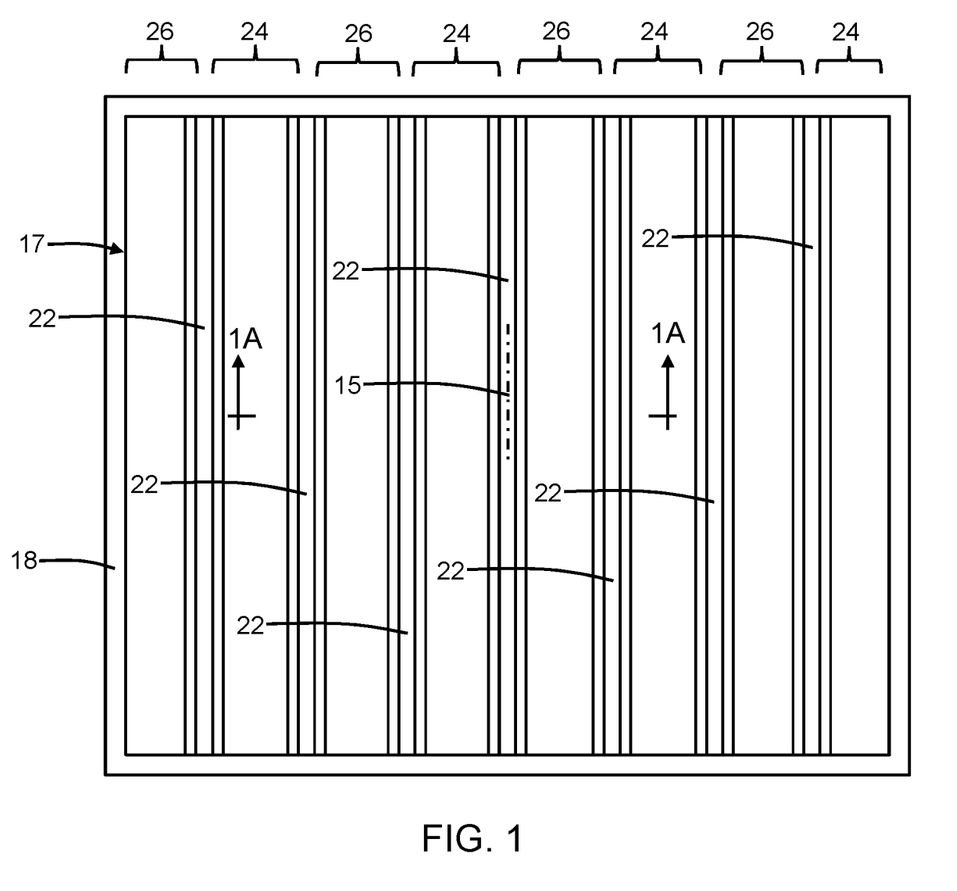
FIG. 1 is a top view of a structure at an initial fabrication stage of a processing method in accordance with embodiments of the invention.
Figure 1A:
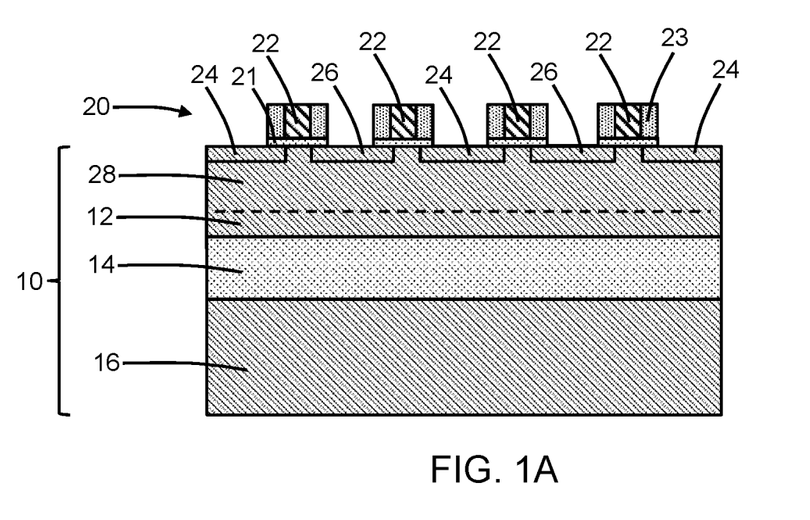
FIG. 1A is a cross-sectional view of the structure taken generally along line 1A-1A in FIG. 1.
Figure 2:
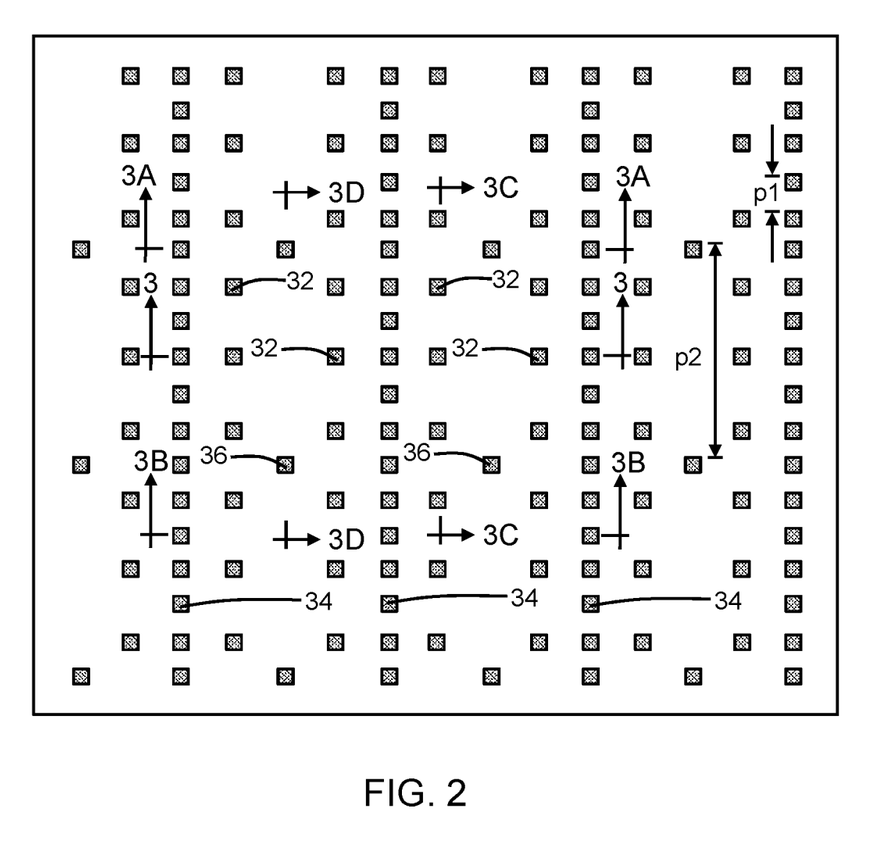
FIG. 2 is a top view of a structure at a fabrication stage of the processing method subsequent to FIG. 1.
Figure 3:
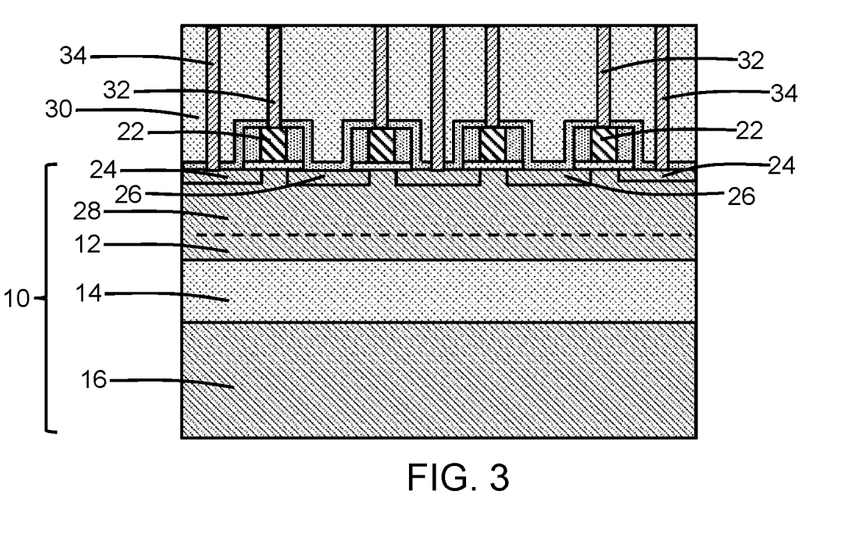
FIG. 3 is a cross-sectional view of the structure taken generally along line 3-3 in FIG. 2.
Figure 3A:
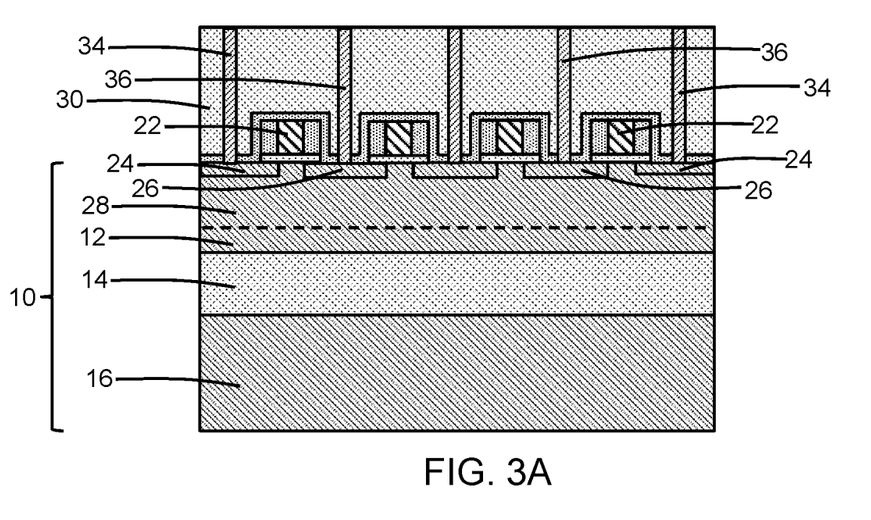
FIG. 3A is a cross-sectional view of the structure taken generally along line 3A-3A in FIG. 2.
Figure 3B:
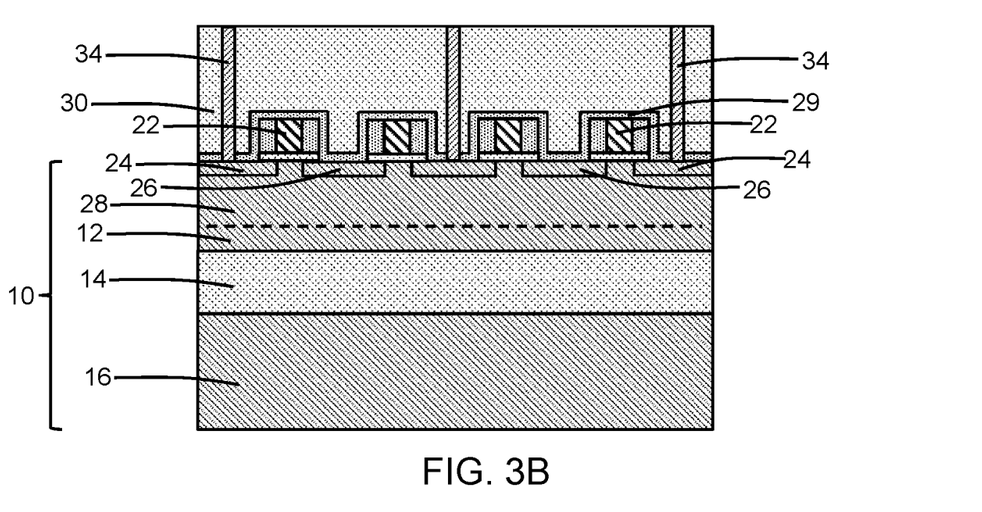
FIG. 3B is a cross-sectional view of the structure taken generally along line 3B-3B in FIG. 2.
Figure 3C:
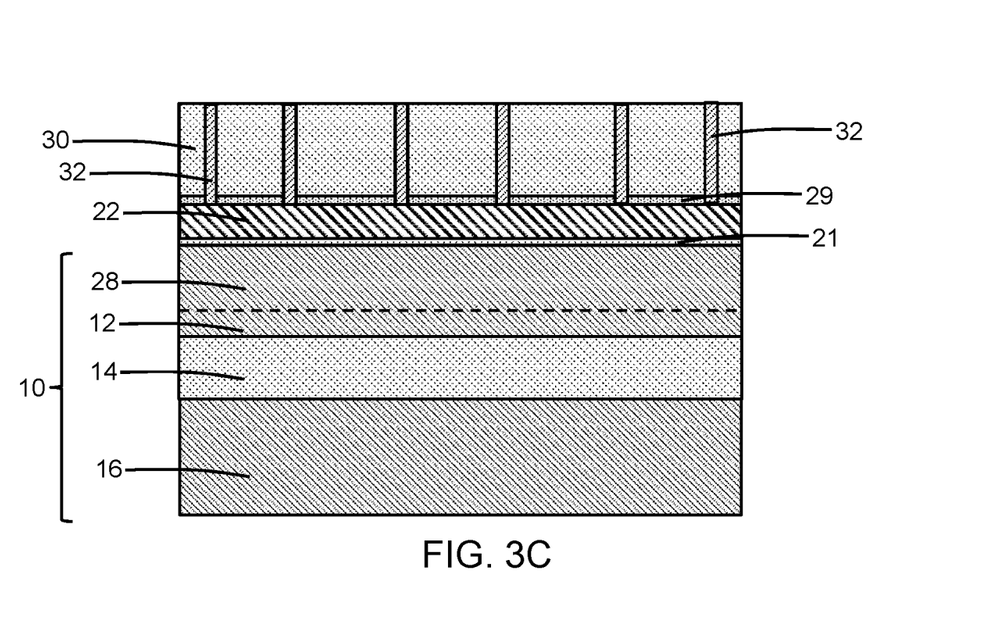
FIG. 3C is a cross-sectional view of the structure taken generally along line 3C-3C in FIG. 2.
Figure 3D:
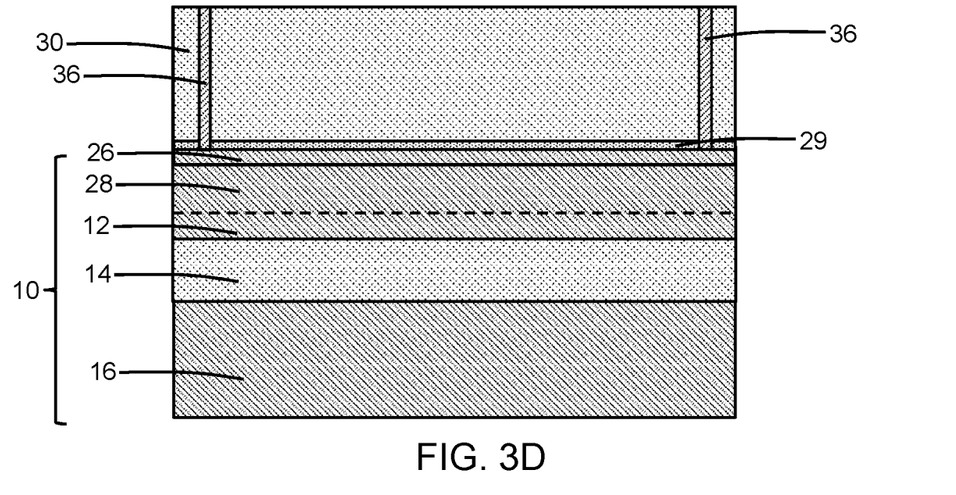
FIG. 3D is a cross-sectional view of the structure taken generally along line 3D-3D in FIG. 2.
Figure 4:
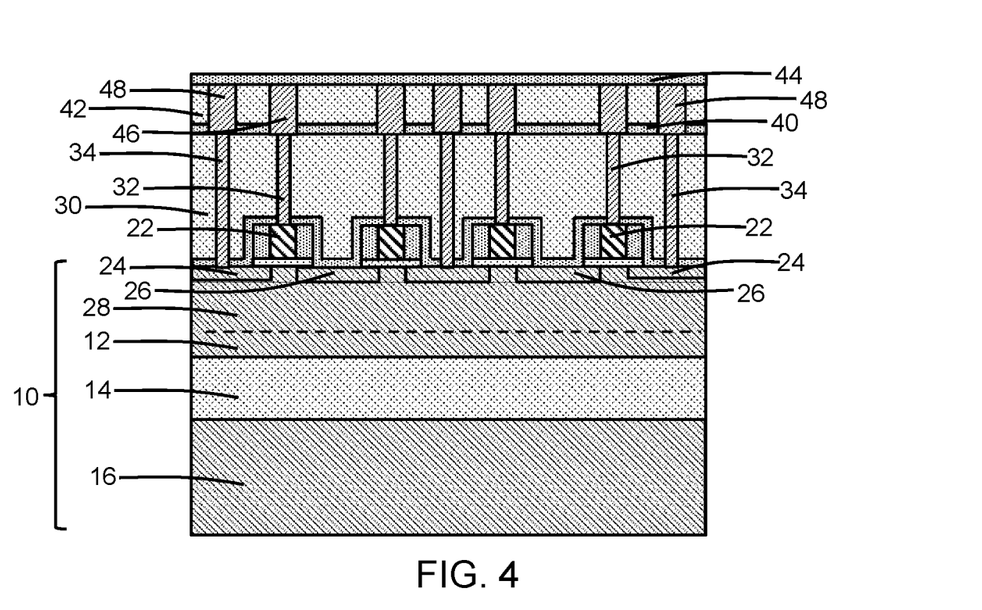
FIGS. 4, 4A, 4B, 4C, and 4D are cross-sectional views of the structure at a fabrication stage of the processing method subsequent to FIGS. 3, 3A, 3B, 3C, and 3D.
Figure 4A:
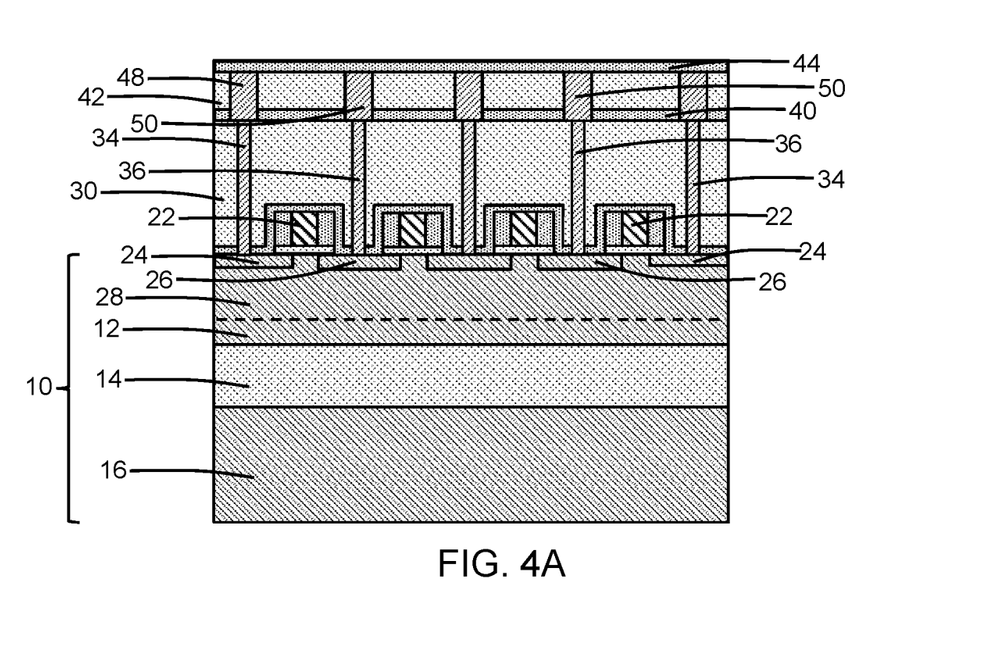
Figure 4B:
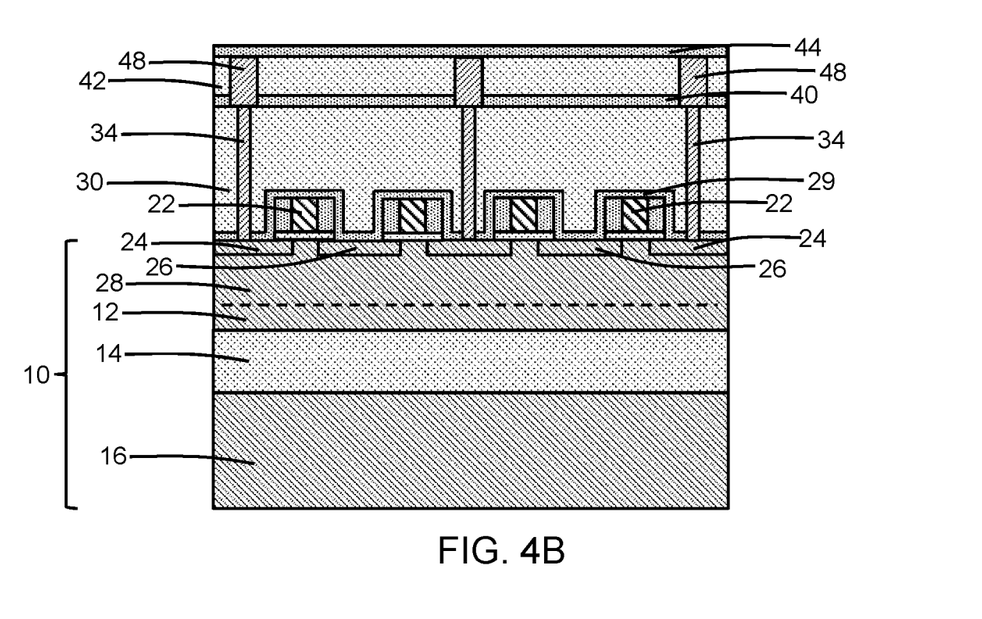
Figure 4C:
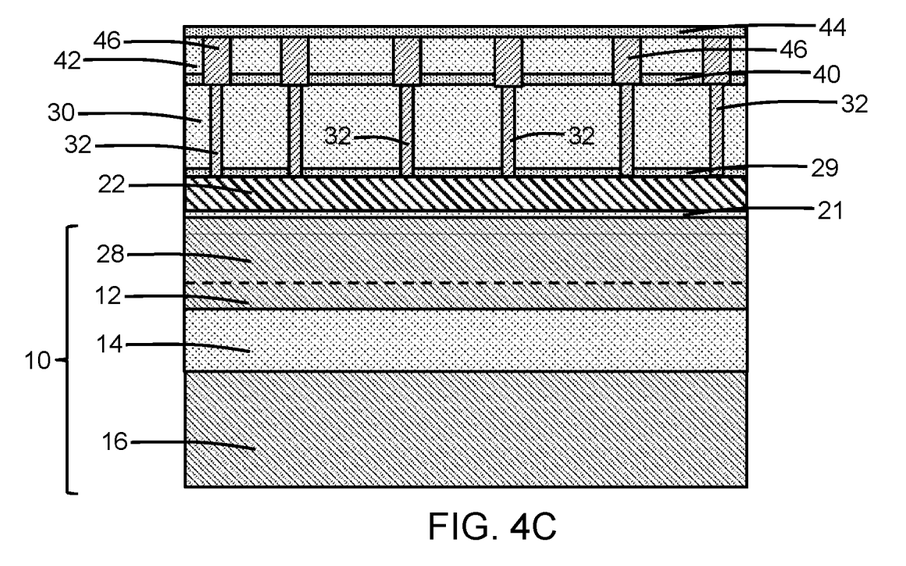
Figure 4D:
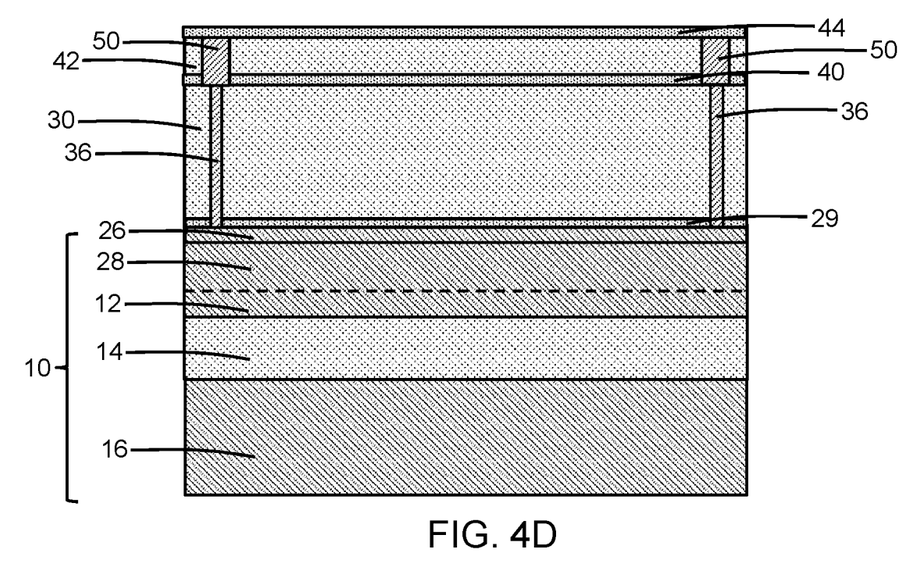

With reference to FIG. 1, 1A and in accordance with embodiments of the invention, a substrate 10 in the representative form of a silicon-on-insulator (SOI) substrate includes a device layer 12, a buried oxide (BOX) layer 14 comprised of silicon dioxide, and a handle substrate 16. The device layer 12 is separated from the handle substrate 16 by the intervening buried oxide layer 14 and may be substantially thinner than the handle substrate 16. The device layer 12 is electrically isolated from the handle substrate 16 by the buried oxide layer 14. The device layer 12 and the handle substrate 16 may be comprised of a semiconductor material, such as single-crystal silicon. The handle substrate 16 may be lightly doped to have, for example, p-type conductivity. Alternatively, the substrate 10 may be a bulk substrate in which a buried polycrystalline region characterized by high resistivity replaces the buried oxide layer 14.

A trench isolation region 18 is formed in the device layer 12. In an embodiment, the trench isolation region 18 may penetrate fully through the device layer 12 to the buried oxide layer 14. The trench isolation region 18 surrounds an active region 17 that is comprised of a portion of the semiconductor material of the device layer 12. The trench isolation region 18 may be formed by a shallow trench isolation technique that patterns trenches in the device layer 12 with lithography and etching processes, deposits a dielectric material to overfill the trenches, and planarizes the dielectric material using chemical mechanical polishing and/or an etch back to remove excess dielectric material from the field. The dielectric material may be comprised of an electrical insulator, such as silicon dioxide, deposited by chemical vapor deposition.

A field-effect transistor 20 may be fabricated by front-end-of-line processing as a device structure in the active device region of the device layer 12. The field-effect transistor 20 may include gates 22 positioned on the device layer 12, as well as source regions 24 and drain regions 26 that may be formed in a well 28. Each gate 22 may be aligned along a longitudinal axis 15. The well 28 may be formed by ion implantation of a dopant having an opposite conductivity type from the source regions 24 and drain regions 26. The source regions 24 and drain regions 26 may be formed by ion implantation of either a p-type or n-type dopant. A channel region is arranged in the device layer 12 beneath each gate 22 laterally between the adjacent source region 24 and the adjacent drain region 26. The gates 22 may be formed, for example, by patterning a deposited layer of heavily-doped polysilicon with lithography and etching processes. Although not shown, the gates 22 may define gate fingers that are connected together at one end to provide a joined or unified gate structure for the field-effect transistor 20. The field-effect transistor 20 may include other elements such as a gate dielectric 21 positioned between the gates 22 and the device layer 12, halo regions and lightly-doped drain extensions in the device layer 12, and sidewall spacers 23 on the gates 22. The gates 22 may have a different construction, such as a T-shape construction having a narrow section adjacent to the gate dielectric 21 and a wide section stacked over the narrow section. The sidewall spacers 23 may have a different construction, such as including air gap spacers. In an embodiment, the field-effect transistor 20 may be deployed in a low-noise amplifier found in a radio-frequency circuit.

With reference to FIGS. 2, 3, 3A, 3B, 3C, and 3D in which like reference numerals refer to like features in FIGS. 1, 1A and at a subsequent fabrication stage of the processing method, a dielectric layer 29 may be formed over the field-effect transistor 20. In an embodiment, the dielectric layer 29 may be comprised of silicon nitride and may be conformally deposited to follow the surface topography. Portions of the dielectric layer 29 may be removed to permit sections of a silicide layer (not shown) to be formed on the gates 22, the source regions 24, and the drain regions 26.

A local interconnect structure or contact level is formed by middle-of-line processing over the field-effect transistor 20. The local interconnect structure includes a dielectric layer 30, as well as gate contacts 32, source contacts 34, and drain contacts 36 that are arranged in the dielectric layer 30. The dielectric layer 30 may be comprised of silicon dioxide, and the gate contacts 32, source contacts 34, and drain contacts 36 may include tungsten, a metal silicide, etc. The gate contacts 32, which are located over the active region 17, penetrate through the dielectric layer 30 to land at a series of locations on each gate 22. The source contacts 34 penetrate through the dielectric layer 30 to land at a series of locations on each source region 24. The drain contacts 36 penetrate through the dielectric layer 30 to land at a series of locations on each drain region 26.

The gate contacts 32 are arranged in respective gate contact rows over the gates 22, the source contacts 34 are arranged in respective source contact rows over the source regions 24, and the drain contacts 36 are arranged in respective drain contact rows over the drain regions 26. The gate contacts 32 in each gate contact row are spaced apart from each other along the respective longitudinal axis 15. The source contact rows of source contacts 34 and the drain contact rows of drain contacts 36 alternate with respect to the gate contact rows of gate contacts 32 in a direction transverse to the longitudinal axes 15 of the gates 22. In an embodiment, the linear density of the drain contacts 36 along the drain contact rows may be less than the linear density of the source contacts 34 along the source contact rows. In that regard, the source contacts 34 have a pitch p1, and the drain contacts 36 have a pitch p2 that is greater than the pitch p1. The larger pitch p2 of the drain contacts 36 accommodates the subsequent formation of openings in the dielectric layer 44 that are eventually closed to define airgaps. The source contacts 34 can have a smaller pitch p1 because the subsequently-formed openings do not overlap with the source regions 24.

With reference to FIGS. 4, 4A, 4B, 4C, and 4D in which like reference numerals refer to like features in FIGS. 3, 3A, 3B, 3C, and 3D and at a subsequent fabrication stage of the processing method, back-end-of-line processing is used to form a metallization level of a back-end-of-line interconnect structure that is coupled by the gate contacts 32, source contacts 34, and drain contacts 36 to the field-effect transistor 20. In particular, dielectric layers 40, 42, 44 are formed over the dielectric layer 30, and the gate contacts 32, source contacts 34, and drain contacts 36, and metal wires 46, 48, 50 are formed in the dielectric layer 42. The metal wires 46 are physically and electrically connected by the gate contacts 32 in the different gate contact rows to the gates 22, the metal wires 48 are physically and electrically connected by the source contacts 34 in the different source contact rows to the source regions 24, and the metal wires 50 are physically and electrically connected by the drain contacts 36 in the different drain contact rows to the drain regions 26. The dielectric layer 42 may be comprised of silicon dioxide, and the dielectric layers 40, 44 may be comprised of silicon nitride.

The metal wires 46 include segments over the gates 22 that are coupled to the gate contacts 32. The metal wires 50 include segments over drain regions 26 that are coupled to the drain contacts 36. The segmentation of the metal wires 46 and the segmentation of the metal wires 50 accommodates the subsequent formation of openings in the dielectric layer 44 that are eventually closed and sealed to define airgaps. The metal wires 48 are not segmented over the source regions 24 because the subsequently-formed openings do not overlap with the source regions 24.

With reference to FIGS. 5, 5A, 5B, 5C, and 5D in which like reference numerals refer to like features in FIGS. 4, 4A, 4B, 4C, and 4D and at a subsequent fabrication stage of the processing method, the dielectric layers 30, 40, 42, 44 are patterned by lithography and etching processes to form openings 60. In an embodiment, the openings 60 may be formed in the dielectric layers 30, 40, 42, 44 with an anisotropic etching process, such as a reactive ion etching process, and subsequently widened and deepened in the dielectric layers 30, 42 with an isotropic etching process. The openings 60 may extend in a vertical direction through the dielectric layers 30, 40, 42, 44 to the dielectric layer 29. The isotropic etching process may remove the materials of the dielectric layers 30, 42 selective to the materials of the dielectric layers 29, 40, 44 and may have a lateral etching component that causes the dielectric layers 30, 42 to laterally recess relative to the dielectric layers 40, 44. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. In an embodiment, the isotropic etching process may use a wet chemical etchant (e.g., an etchant solution containing hydrofluoric acid).

Figure 5:
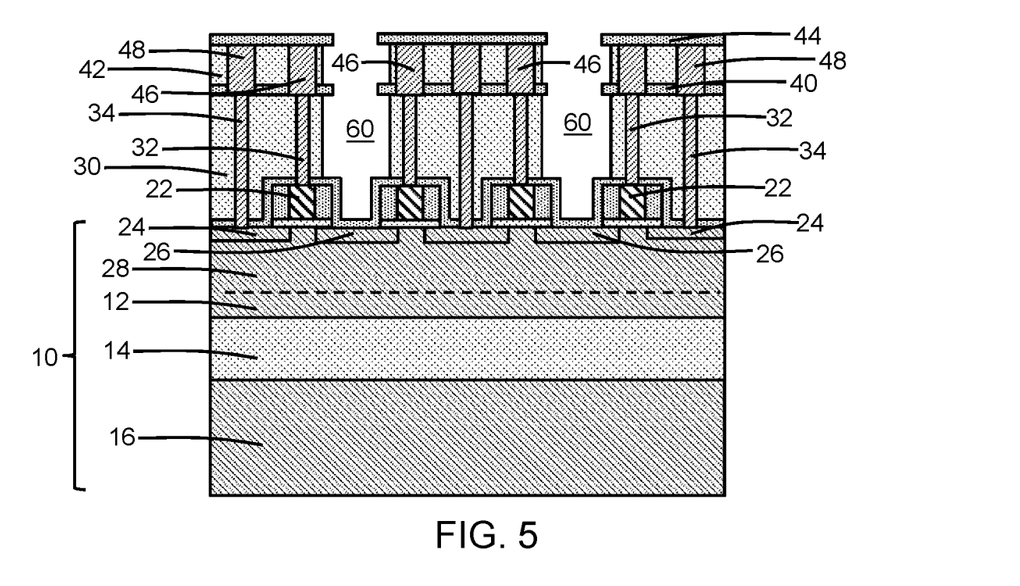
FIGS. 5, 5A, 5B, 5C, and 5D are cross-sectional views of the structure at a fabrication stage of the processing method subsequent to FIGS. 4, 4A, 4B, 4C, and 4D.
Figure 5A:
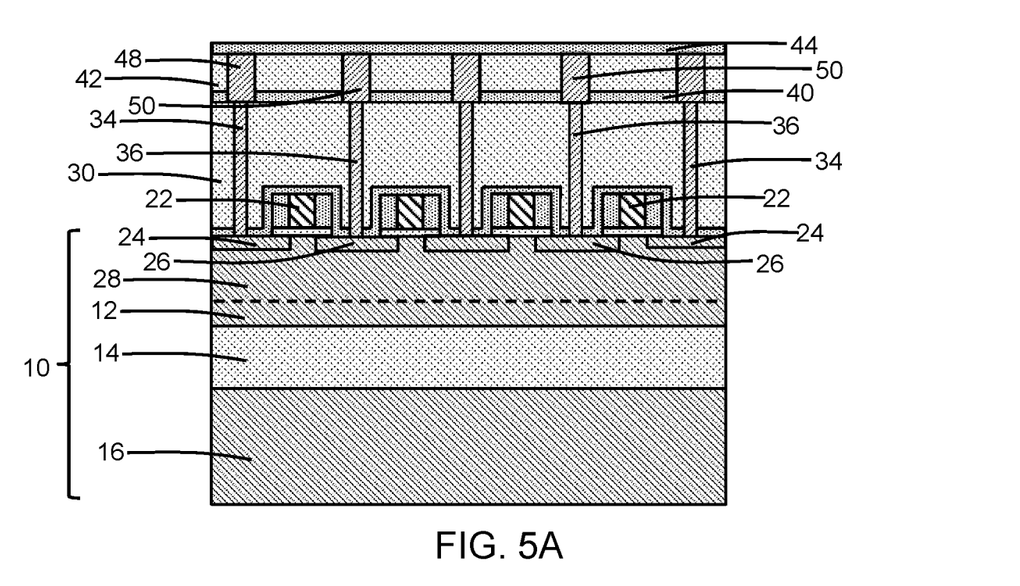

Each opening 60 includes portions in the dielectric layer 42 is stacked over portions in the dielectric layer 30. As best shown in FIG. 5A, the openings 60 are absent over the gates 22 and the drain regions 26 at the locations of adjacent drain contacts 36 paired in adjacent drain contact rows. The openings 60 are also absent over the source regions 24 such that the dielectric layers 30, 42 are intact and unbroken over the source regions 24.

Figure 5B:
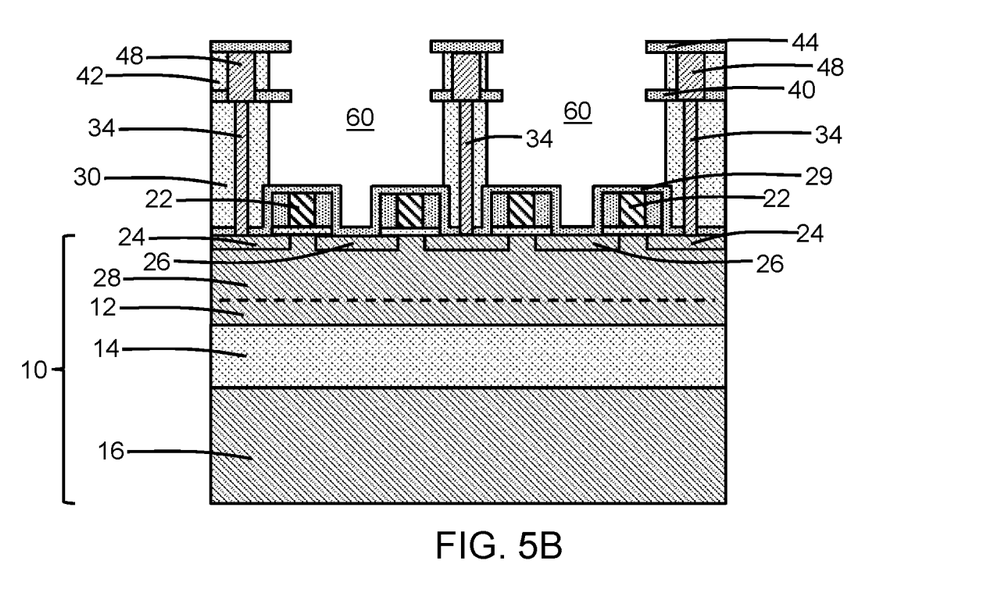
Figure 5C:
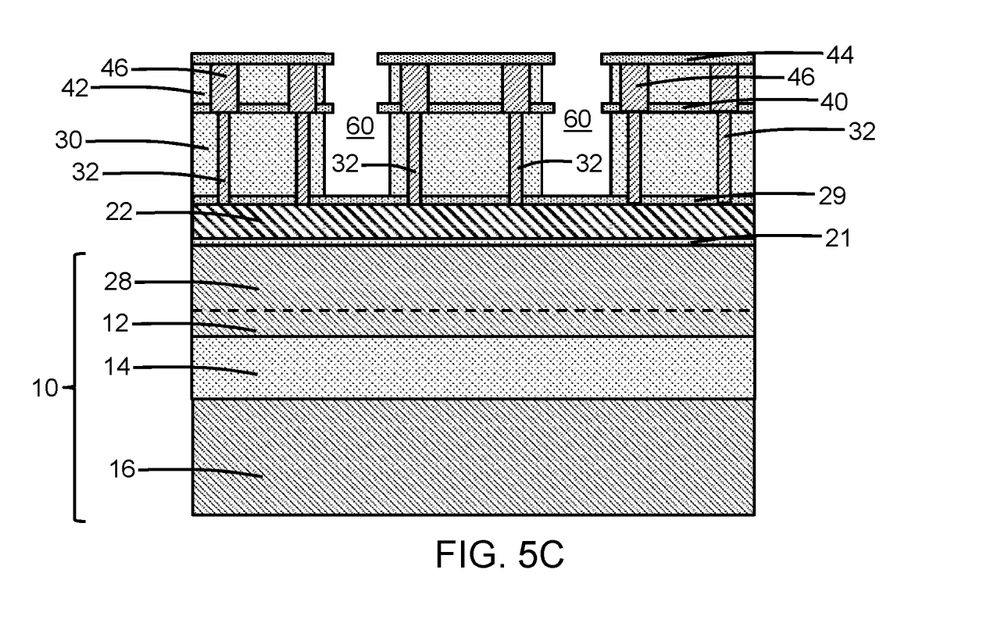
Figure 5D:
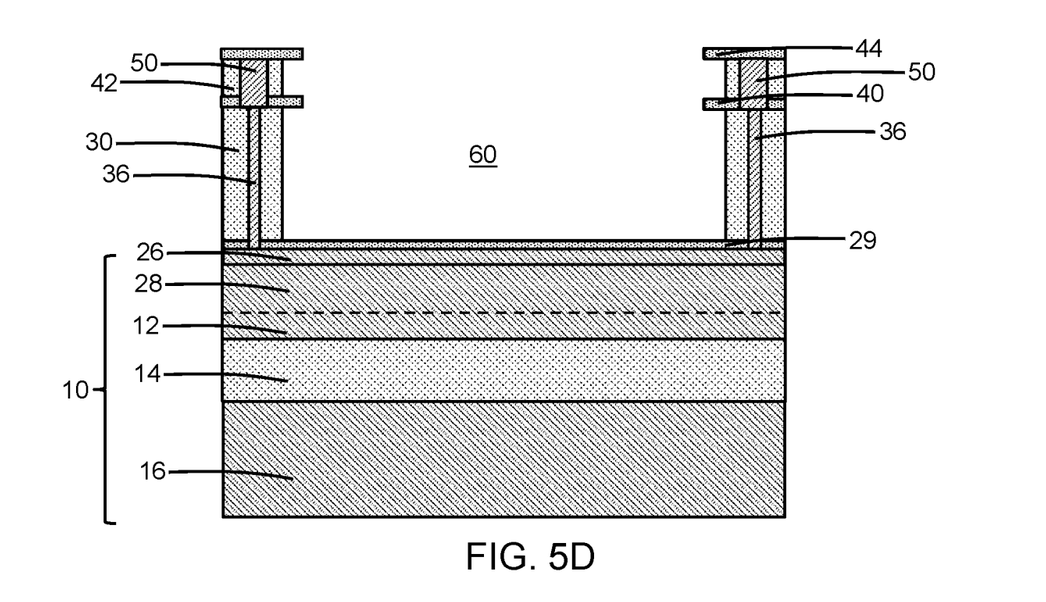

The gate contacts 32 in the gate contact row over each gate 22 are longitudinally spaced in the dielectric layer 30 along the longitudinal axis 15 of the corresponding gate 22. As best shown in FIG. 5, each opening 60 includes portions that are positioned in the dielectric layer 30 over one of the gates 22 between adjacent pairs of the gate contacts 32 in different gate contact rows. As best shown in FIG. 5C, each opening 60 includes portions that are positioned in the dielectric layer 30 over one of the gates 22 between adjacent pairs of the gate contacts 32 in the same gate contact row. As best shown in FIG. 5D, each opening 60 includes a portion that is positioned in the dielectric layer 30 over one of the drain regions 26 between each adjacent pair of the drain contacts 36 in each drain contact row. This portion of each opening 60 terminates adjacent to each of the drain contacts 36 in the adjacent pair, and is connected in fluid communication with portions of the opening 60 between the gate contacts 32 over the adjacent gates 22. For each opening 60 and each adjacent pair of the drain contacts 36, the portions of the opening 60 in the dielectric layer 30 over the gate 22 and the portion of the opening 60 in the dielectric layer 30 over the drain region 26 are contiguous and uninterrupted. As best shown in FIG. 5B, each opening 60 is wider in the dielectric layer 30 at positions along the longitudinal axis 15 where the different portions of the opening 60 over the gate 22 and the drain region 26 are contiguous.

The metal wires 46 in the gate contact row over each gate 22 are longitudinally spaced in the dielectric layer 42 along the longitudinal axis 15 of the corresponding gate 22. As best shown in FIG. 5, each opening 60 includes portions that are positioned in the dielectric layer 42 over one of the gates 22 between adjacent pairs of the metal wires 46 in different gate contact rows. As best shown in FIG. 5C, each opening 60 includes portions that are positioned in the dielectric layer 42 over one of the gates 22 between adjacent pairs of the metal wires 46 in the same gate contact row. As best shown in FIG. 5D, each opening 60 includes a portion that is positioned in the dielectric layer 42 over one of the drain regions 26 between each adjacent pair of the metal wires 50 in each drain contact row. This portion of each opening 60 terminates adjacent to each of the metal wires 50 in the adjacent pair, and is connected in fluid communication with portions of the opening 60 between the gate contacts 32 over the adjacent gates 22. For each opening 60 and each adjacent pair of the metal wires 50, the portions of the opening 60 in the dielectric layer 42 over the adjacent gates 22 and the portion of the opening 60 in the dielectric layer 42 over the drain region 26 are contiguous and uninterrupted. As best shown in FIG. 5B, each opening 60 is wider in the dielectric layer 42 at positions along the longitudinal axis 15 where the different portions of the opening 60 over the gate 22 and the drain region 26 are contiguous.

With reference to FIGS. 6, 6A, 6B, 6C, and 6D in which like reference numerals refer to like features in FIGS. 5, 5A, 5B, 5C, and 5D and at a subsequent fabrication stage of the processing method, a dielectric layer 70 is formed over the openings 60 and dielectric layer 44 that closes the openings 60 to define airgaps 65. The dielectric layer 70 may be comprised of a dielectric material, such as silicon dioxide, and may pinch off during deposition to close the openings 60. Wires and vias (not shown) may be subsequently formed in the dielectric layer 70 and may be connected to the metal wires 46, 48, 50.

Figure 6:
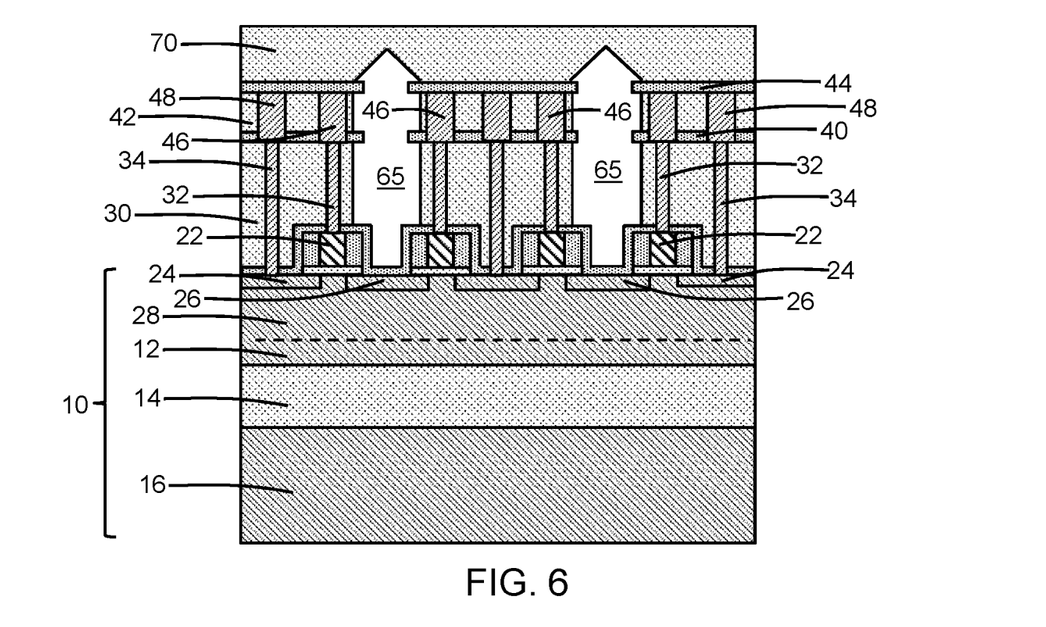
FIGS. 6, 6A, 6B, 6C, and 6D are cross-sectional views of the structure at a fabrication stage of the processing method subsequent to FIGS. 5, 5A, 5B, 5C, and 5D.
Figure 6A:
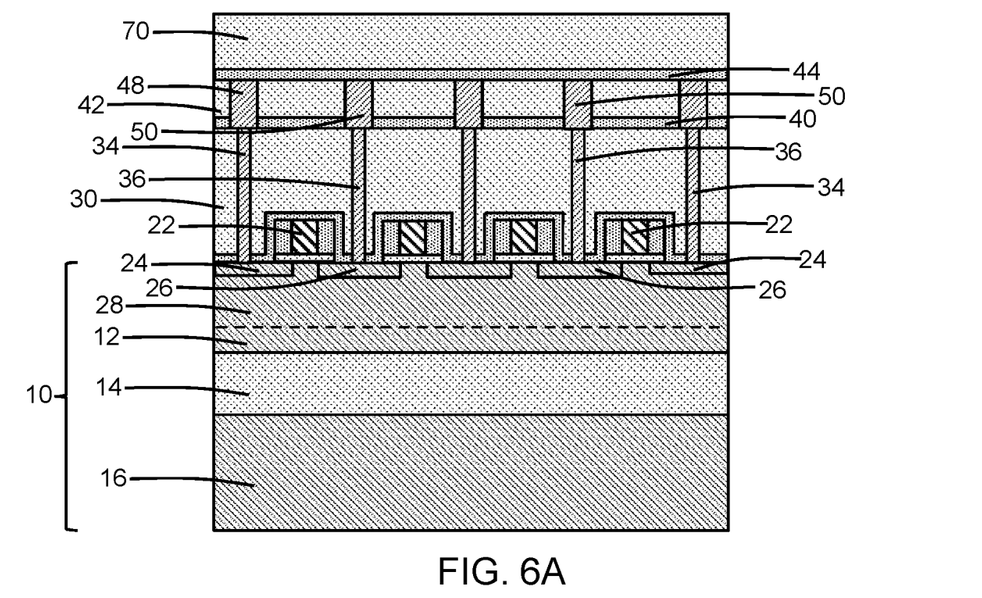

The portions of each airgap 65 in the dielectric layer 42 are stacked over the portions of each airgap 65 in the dielectric layer 30. As best shown in FIG. 6A, the airgaps 65 are absent over the gates 22 and the drain regions 26 at the locations of adjacent drain contacts 36 paired in adjacent drain contact rows. The airgaps 65 are also absent over the source regions 24 such that the dielectric layers 30, 42 are unbroken over the source regions 24. The airgaps 65 include upper portions in the dielectric layer 70 that is formed to seal and close the openings 60.

Figure 6B:
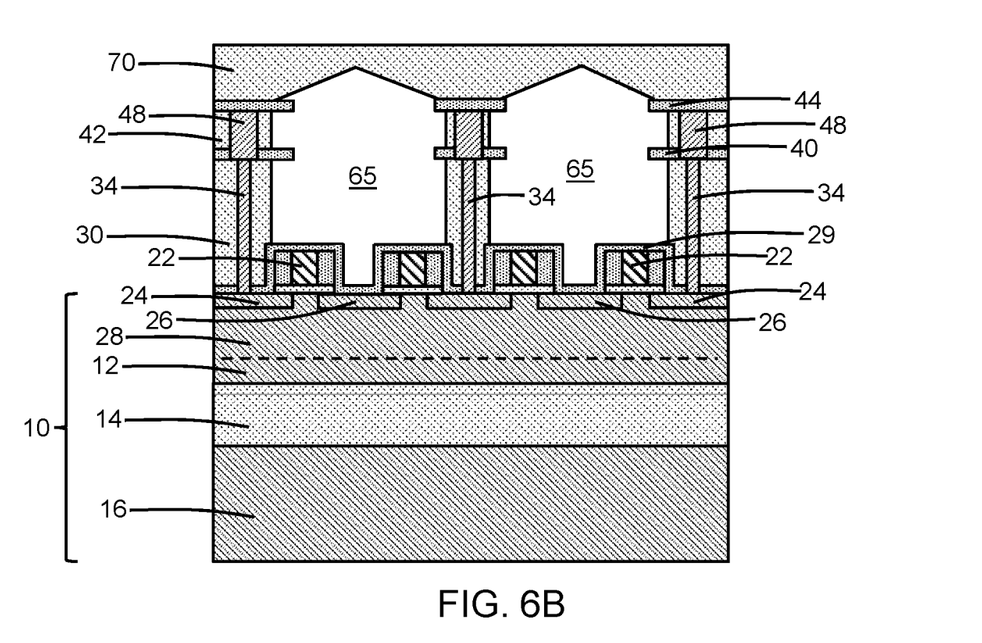
Figure 6C:
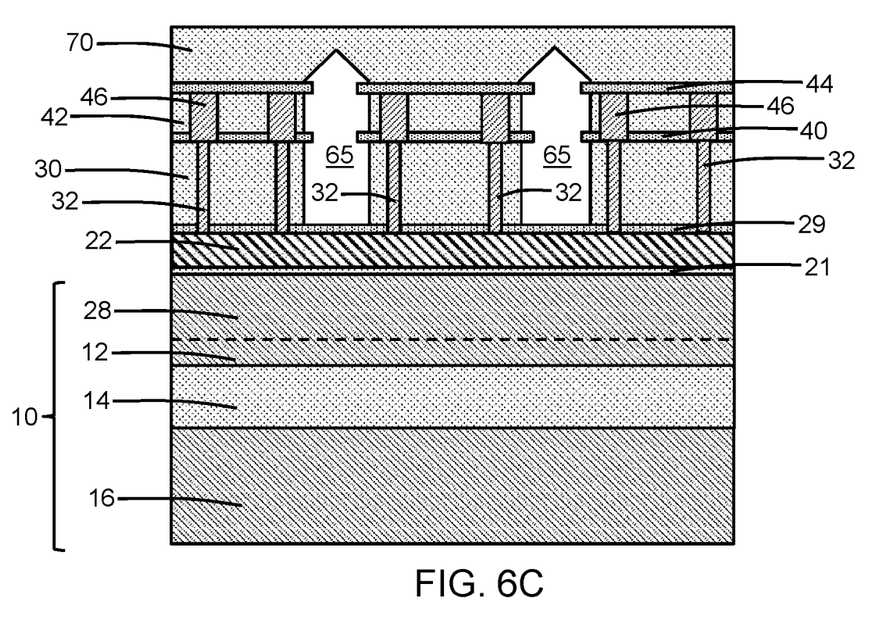
Figure 6D:
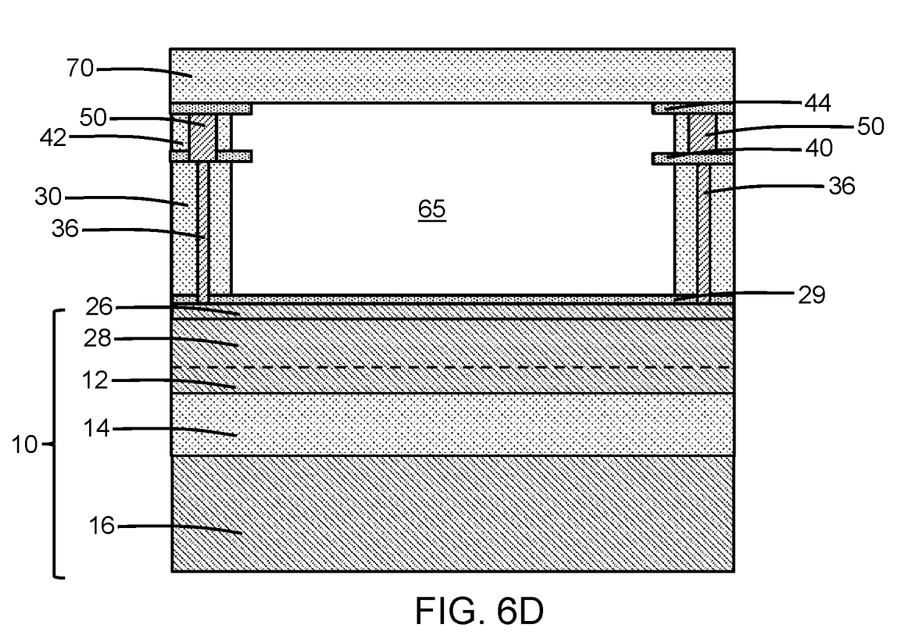

The gate contacts 32 in the gate contact row over each gate 22 are longitudinally spaced in the dielectric layer 30 along the longitudinal axis 15 of the corresponding gate 22. As best shown in FIG. 6, each airgap 65 includes portions that are positioned in the dielectric layer 30 over one of the gates 22 between adjacent pairs of the gate contacts 32 in different gate contact rows. As best shown in FIG. 6C, each airgap 65 includes portions that are positioned in the dielectric layer 30 over one of the gates 22 between adjacent pairs of the gate contacts 32 in the same gate contact row. As best shown in FIG. 6D, each airgap 65 includes a portion that is positioned in the dielectric layer 30 over one of the drain regions 26 between each adjacent pair of the drain contacts 36 in each drain contact row. This portion of each airgap 65 terminates adjacent to each of the drain contacts 36 in the adjacent pair, and is connected in fluid communication with portions of the airgap 65 between the gate contacts 32 over the adjacent gates 22. For each airgap 65 and each adjacent pair of the drain contacts 36, the portions of the airgap 65 in the dielectric layer 30 over the gate 22 and the portion of the airgap 65 in the dielectric layer 30 over the drain region 26 are contiguous and uninterrupted. As best shown in FIG. 6B, each airgap 65 is wider in the dielectric layer 30 at positions along the longitudinal axis 15 where the different portions of the airgap 65 over the gate 22 and the drain region 26 are contiguous.

The metal wires 46 in the gate contact row over each gate 22 are longitudinally spaced in the dielectric layer 42 along the longitudinal axis 15 of the corresponding gate 22. As best shown in FIG. 6, each airgap 65 includes portions that are positioned in the dielectric layer 42 over one of the gates 22 between adjacent pairs of the metal wires 46 in different gate contact rows. As best shown in FIG. 6C, each airgap 65 includes portions that are positioned in the dielectric layer 42 over one of the gates 22 between adjacent pairs of the metal wires 46 in the same gate contact row. As best shown in FIG. 6D, each airgap 65 includes a portion that is positioned in the dielectric layer 42 over one of the drain regions 26 between each adjacent pair of the metal wires 50 in each drain contact row. This portion of each airgap 65 terminates adjacent to each of the metal wires 50 in the adjacent pair, and is connected in fluid communication with portions of the airgap 65 between the metal wires 46 over the adjacent gates 22. For each airgap 65 and each adjacent pair of the metal wires 46, the portions of the airgap 65 in the dielectric layer 42 over the gate 22 and the portion of the airgap 65 in the dielectric layer 42 over the drain region 26 are contiguous and uninterrupted. As best shown in FIG. 6B, each airgap 65 is wider in the dielectric layer 42 at positions along the longitudinal axis 15 where the portions of the airgap 65 over the gate 22 and the drain region 26 are contiguous.

The airgaps 65 may be characterized by a permittivity or dielectric constant of near unity (i.e., vacuum permittivity). The airgaps 65 may be filled by atmospheric air at or near atmospheric pressure, may be filled by another gas at or near atmospheric pressure, or may contain atmospheric air or another gas at a sub-atmospheric pressure (e.g., a partial vacuum). Portions of the dielectric layer 30 are positioned between the contacts 32, 34, 36 and the openings 60 such that solid dielectric material isolates the contacts 32, 34, 36 from the airgaps 65. Portions of the dielectric layer 42 are positioned between the metal wires 46, 48, 50 and the openings 60 such that solid dielectric material isolates the metal wires 46, 48, 50 from the airgaps 65.

In an alternative embodiment, the dielectric layer 70 may be deposited before the openings 60 are patterned such that the openings 60 penetrate through the dielectric layer 70 when formed, and the dielectric layer used to close the openings 60 may be associated with a higher metallization level of the back-end-of-line interconnect structure such that the airgaps 65 have a greater height.

The airgaps 65 may be effective to reduce the parasitic capacitance between the gates 22 and other conductive elements of the field-effect transistor 20 because of the dielectric constant reduction in comparison with an unbroken solid dielectric material in the same space. The reduction in parasitic capacitance provided by the airgaps 65 may alleviate the negative impact on gain and noise figure that arises from placing the gate contacts 32 over the gates 22 within the active region 17 associated with the field-effect transistor 20.

Figure 7:
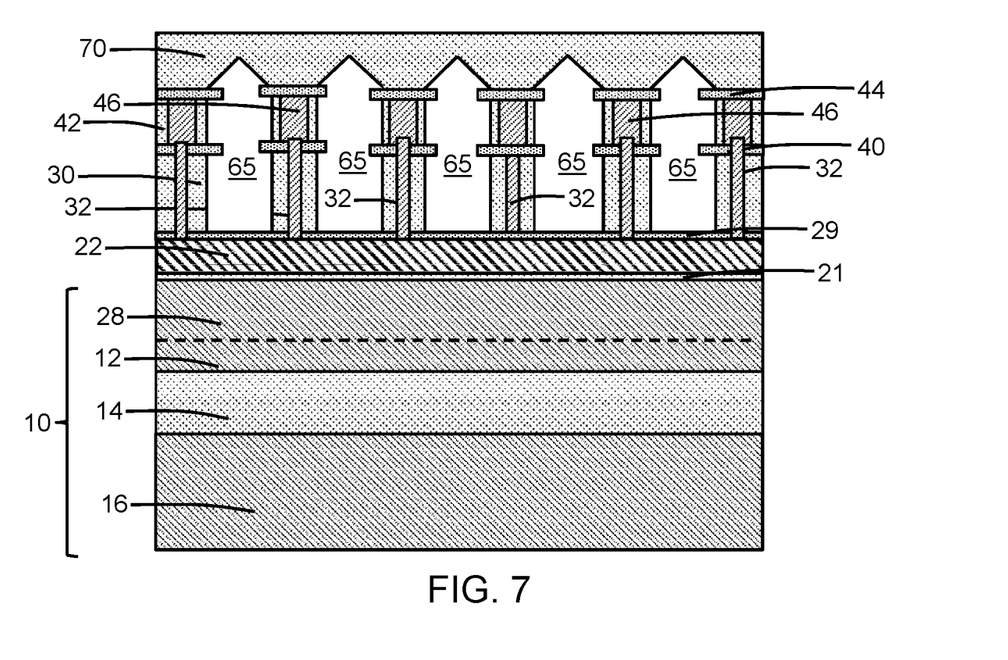
FIGS. 7 and 8 are cross-sectional views of a structure in accordance with an alternative embodiment of the invention.
Figure 8:
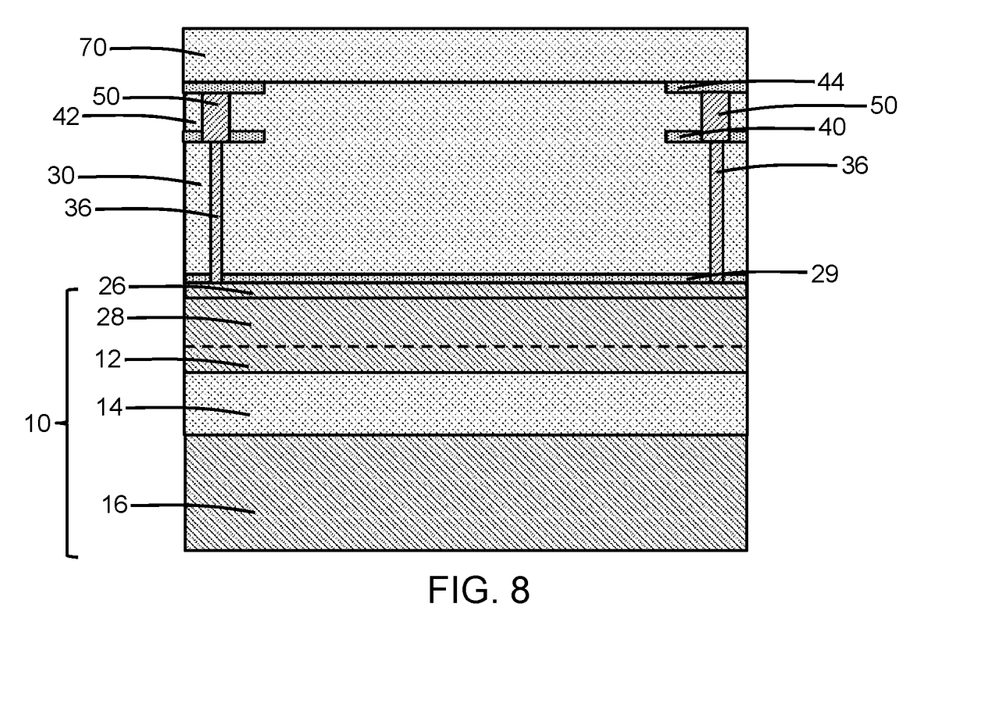

With reference to FIGS. 7, 8 and in accordance with alternative embodiments of the invention, the openings 60 may be modified such that the airgaps 65 defined by the closed openings 60 are only positioned over the gates 22 and do not extend over the drain regions 26 between the drain contacts 36. Each opening 60 and airgap 65 is positioned between each adjacent pair of gate contacts 32 in each gate contact row. The openings 60 and airgaps 65 are nonadjacent and noncontiguous in that pairs of openings 60 and, therefore, pairs of the airgaps 65 lack a common border such that each airgap 65 is isolated from all other airgaps 65. The modification of the openings 60 changing the spatial extent of the airgaps 65 may be provided when the dielectric layers 30, 40, 42, 44 are patterned through changes to the etch mask used for the lithography process. In an embodiment, the linear density of the drain contacts 36 along the drain contact rows may be increased because of the absence of portions of the airgaps 65 between the drain contacts 36. For example, the linear density of the drain contacts 36 along each drain contact row may be equal to the linear density of the source contacts 34 along each source contact row.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a trench isolation region;
an active region of semiconductor material surrounded by the trench isolation region;
a field-effect transistor including a first gate within the active region, the first gate having a longitudinal axis;
a first dielectric layer over the field-effect transistor;
a first gate contact coupled to the first gate, the first gate contact positioned in the first dielectric layer over the active region;
a second gate contact coupled to the first gate, the second gate contact positioned in the first dielectric layer over the active region, and the second gate contact spaced along the longitudinal axis from the first gate contact; and
a first airgap including a first portion positioned in the first dielectric layer over the first gate between the first gate contact and the second gate contact.

2. The structure of claim 1 wherein the field-effect transistor includes a drain region adjacent to the first gate, and further comprising:
a first drain contact in the first dielectric layer, the first drain contact coupled to the drain region; and
a second drain contact in the first dielectric layer, the second drain contact coupled to the drain region,
wherein the first airgap includes a second portion positioned in the first dielectric layer over the drain region between the first drain contact and the second drain contact.

3. The structure of claim 2 wherein the second portion of the first airgap terminates adjacent to the first drain contact and adjacent to the second drain contact.

4. The structure of claim 2 wherein the first portion and the second portion of the first airgap are contiguous.

5. The structure of claim 2 wherein the first drain contact and the second drain contact are arranged with a first pitch, the field-effect transistor includes a source region adjacent to the first gate, and further comprising:
a first source contact in the first dielectric layer, the first source contact coupled to the source region; and
a second source contact in the first dielectric layer, the second source contact coupled to the source region,
wherein the first source contact and the second source contact are arranged with a second pitch that is less than the first pitch.

6. The structure of claim 2 wherein the field-effect transistor includes a source region adjacent to the first gate, and the first dielectric layer is unbroken over the source region.

7. The structure of claim 2 further comprising:
a third gate contact coupled to the first gate, the third gate contact positioned in the first dielectric layer over the active region, and the third gate contact spaced along the longitudinal axis from the second gate contact,
wherein the first airgap includes a third portion between the second gate contact and the third gate contact.

8. The structure of claim 7 wherein the first portion, the second portion, and the third portion of the first airgap are contiguous.

9. The structure of claim 2 further comprising:
a second dielectric layer over the first dielectric layer;
a first metal wire in the second dielectric layer over the active region, the first metal wire coupled to the first drain contact; and
a second metal wire in the second dielectric layer over the active region, the second metal wire coupled to the second drain contact,
wherein the first airgap includes a third portion positioned in the second dielectric layer over the second portion of the first airgap.

10. The structure of claim 2 wherein the field-effect transistor includes a second gate, the drain region is laterally positioned between the first gate and the second gate, and further comprising:
a third gate contact coupled to the second gate, the third gate contact arranged in the first dielectric layer over the active region; and
a fourth gate contact coupled to the second gate, the fourth gate contact arranged in the first dielectric layer over the active region,
wherein the first airgap includes a third portion positioned in the first dielectric layer over the second gate between the third gate contact and the fourth gate contact.

11. The structure of claim 1 further comprising:
a third gate contact coupled to the first gate, the third gate contact arranged in the first dielectric layer over the active region, and the third gate contact spaced along the longitudinal axis from the second gate contact,
wherein the first airgap includes a second portion between the second gate contact and the third gate contact.

12. The structure of claim 11 wherein the field-effect transistor includes a drain region adjacent to the first gate, the first airgap includes a third portion positioned in the first dielectric layer over the drain region, and the first portion and the second portion of the first airgap are connected by the third portion of the first airgap.

13. The structure of claim 1 further comprising:
a second dielectric layer over the first dielectric layer,
wherein the first airgap includes a second portion positioned in the second dielectric layer over the first portion of the first airgap.

14. The structure of claim 13 further comprising:
a first metal wire in the second dielectric layer, the first metal wire coupled to the first gate contact; and
a second metal wire in the second dielectric layer, the second metal wire coupled to the second gate contact, and the second metal wire spaced along the longitudinal axis of the first gate from the first metal wire,
wherein the second portion of the first airgap is positioned between the first metal wire and the second metal wire.

15. The structure of claim 14 further comprising:
a third gate contact coupled to the first gate, the third gate contact positioned in the first dielectric layer over the active region, and the third gate contact spaced along the longitudinal axis from the second gate contact; and
a second airgap positioned in the first dielectric layer over the first gate between the second gate contact and the third gate contact.

16. The structure of claim 15 wherein the first airgap and the second airgap are noncontiguous.

17. A method comprising:
forming a trench isolation region that surrounds an active region of semiconductor material;
forming a field-effect transistor including a gate within the active region, wherein the gate has a longitudinal axis;
forming a first dielectric layer over the field-effect transistor;
forming a first gate contact and a second gate contact that are coupled to the gate, wherein the first gate contact and the second gate contact are positioned in the first dielectric layer over the active region, and the second gate contact is spaced along the longitudinal axis from the first gate contact; and
forming an airgap including a first portion positioned in the first dielectric layer over the gate between the first gate contact and the second gate contact.

18. The method of claim 17 wherein the field-effect transistor includes a drain region adjacent to the gate, and further comprising:
forming a first drain contact and a second drain contact in the first dielectric layer,
wherein the first drain contact and the second drain contact are coupled to the drain region, and the airgap includes a second portion positioned in the first dielectric layer over the drain region between the first drain contact and the second drain contact.

19. The method of claim 17 further comprising:
forming a third gate contact coupled to the gate,
wherein the third gate contact is arranged in the first dielectric layer over the active region, and the airgap includes a second portion between the second gate contact and the third gate contact.

20. The method of claim 17 further comprising:
forming a second dielectric layer over the first dielectric layer,
wherein the airgap includes a second portion positioned in the second dielectric layer over the first portion of the airgap.

* * * * *